(12) United States Patent
Agarwal et al.

(10) Patent No.: US 7,800,407 B1
(45) Date of Patent: Sep. 21, 2010

(54) MULTIPLE VOLTAGE MODE PRE-CHARGING AND SELECTIVE LEVEL SHIFTING

(75) Inventors: Amit Agarwal, Hillsboro, OR (US);
Steven K. Hsu, Lake Oswego, OR (US);
Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/492,938

(22) Filed: Jun. 26, 2009

(51) Int. Cl.
*H03K 19/0175* (2006.01)

(52) U.S. Cl. .............................. 326/80; 326/68; 326/95; 326/98

(58) Field of Classification Search ........................ None
See application file for complete search history.

(56) References Cited

U.S. PATENT DOCUMENTS 6,366,124 B1 * 4/2002 Kwong ........................ 326/81
2009/0116307 A1 * 5/2009 Cottier et al. .......... 365/189.11

* cited by examiner

*Primary Examiner*—Anh Q Tran
(74) *Attorney, Agent, or Firm*—Garret IP, LLC

(57) ABSTRACT

To pre-charge a node to one of first and second voltage levels in response to inputs received at the corresponding voltage level, to selectively level shift the node from the first voltage level to the second voltage level when in a first voltage mode, and to maintain the node at the second voltage level when in a second voltage mode. Level shifting from first voltage level may be performed within one gate stage that may be bypassed when in the second voltage mode. The node may be discharged with no delay difference between the first and second voltage modes. Inputs may include a clock signal, which may be received at either of the first and second voltage levels without level shifting the clock signal. A circuit may be implemented with a multi-core processor system to permit selective voltage mode operation of the cores.

20 Claims, 6 Drawing Sheets

MULTIPLE VOLTAGE MODE PRE-CHARGING AND SELECTIVE LEVEL SHIFTING

BACKGROUND

Power consumption of integrated circuits may be reduced and efficiencies may be increased by reducing operating voltages of the integrated circuits.

Some circuits are more amenable to lower operating voltages than others. Where integrated circuits within a system operate at lower voltages, conflicts or contention may arise between the circuits. These conflict and contention can be alleviated by level shifting the operating voltage of part of the circuits to higher voltage. But level shifting may introduce delays.

For example, an integrated circuit may include circuitry to pre-charge a node to a desired voltage level. The operating speed of the circuitry may depend upon the speed of the pre-charge circuitry. Where level shifting introduces a delay in the pre-charging, subsequent events, such as memory accessing, may be delayed.

Level shifting becomes more challenging when inputs to a circuit change between a plurality of operating voltages, such as where cores of a multi-core processor are controllable to operate and output logic at multiple voltage levels.

BRIEF DESCRIPTION OF THE DRAWINGS/FIGURES

Figure 3:
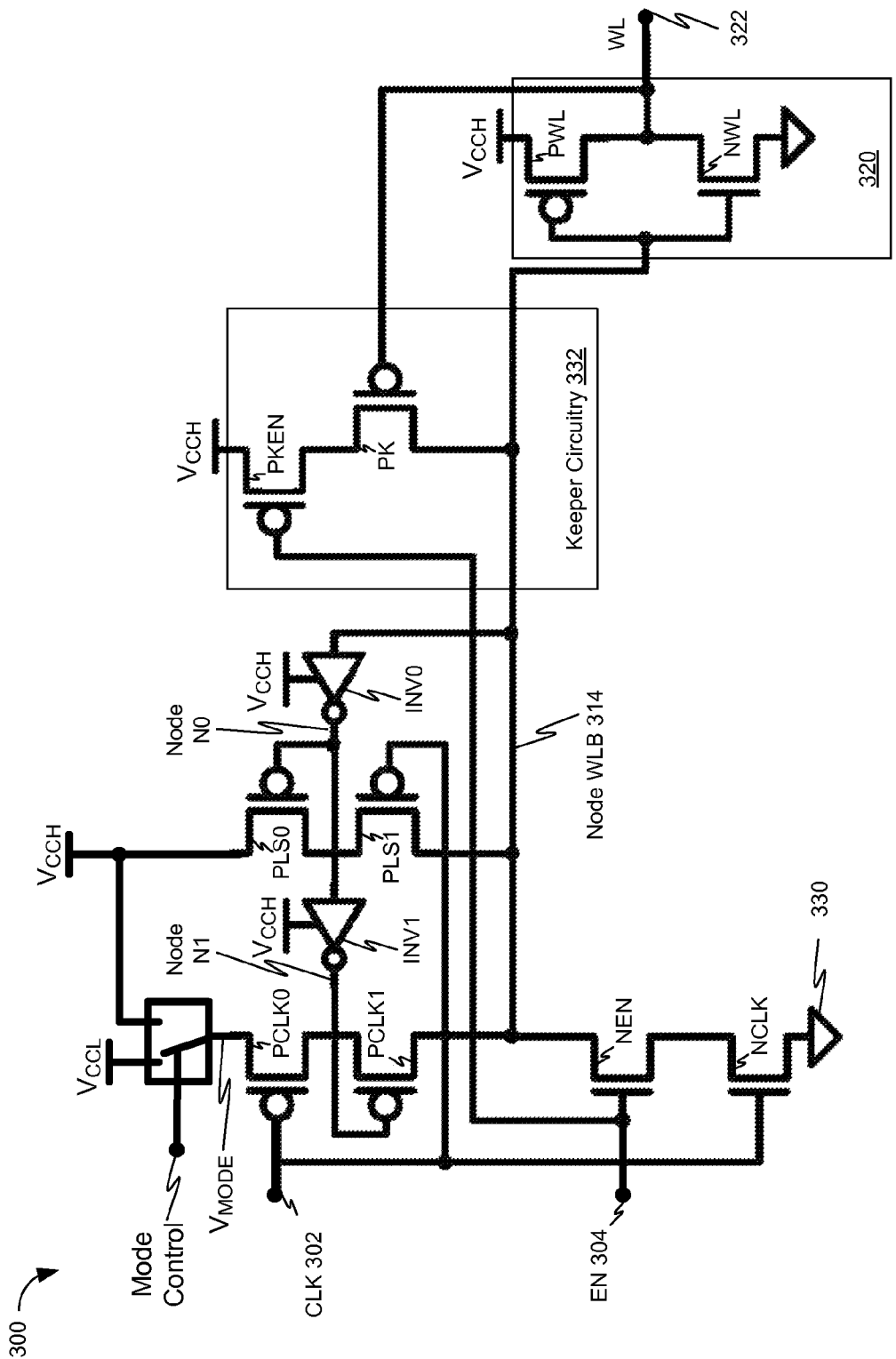
FIG. 3 is a circuit diagram of an exemplary circuit to selectively level shift a node from a first voltage level to a second voltage level.
Figure 4:
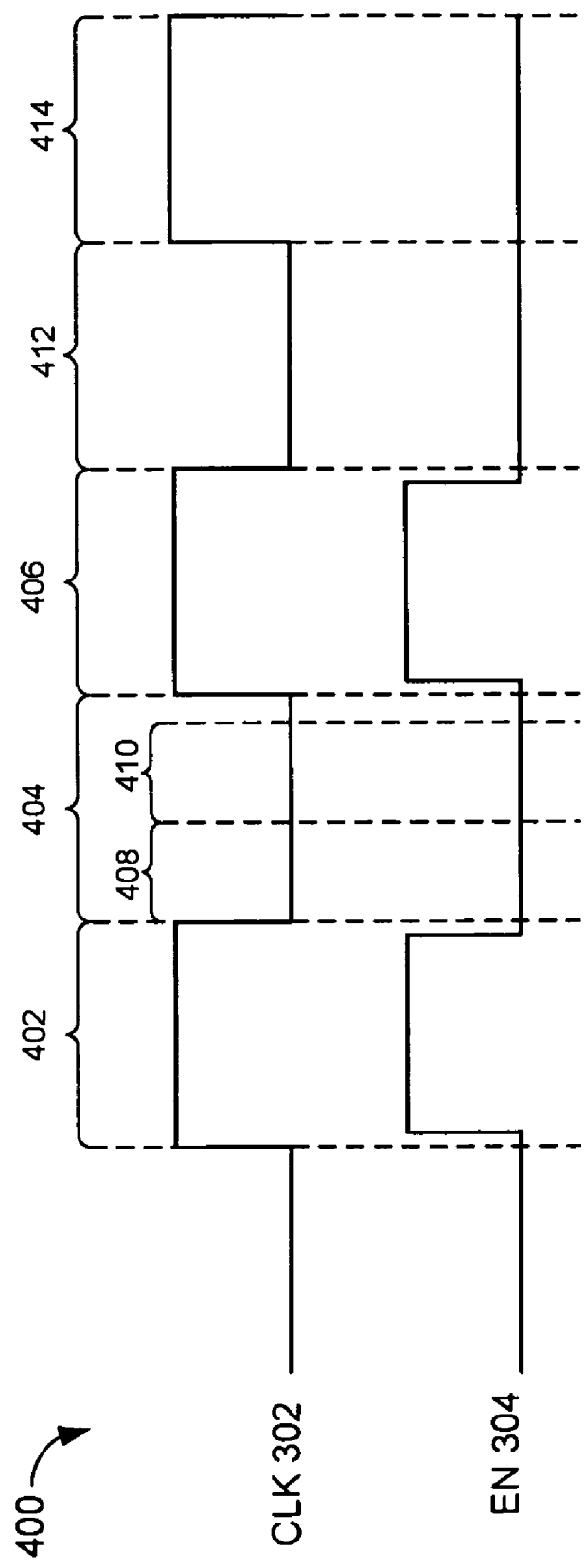

FIG. 4. is an exemplary timing diagram, described with reference to FIG. 3.

Figure 5:
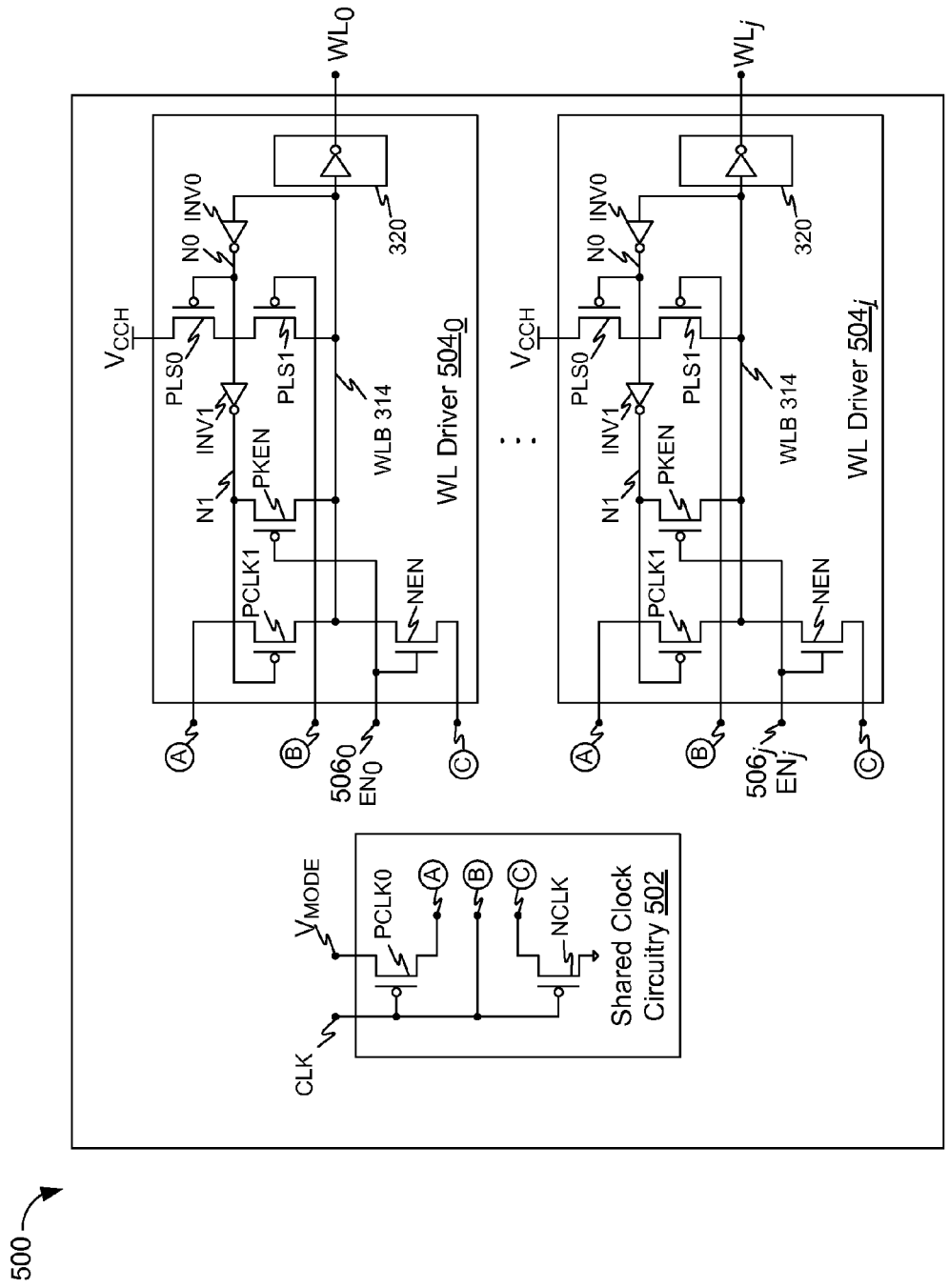

FIG. 5 is a circuit diagram of an exemplary circuit to selectively level shift each of a plurality of nodes from a first voltage level to a second voltage level.

Figure 6:
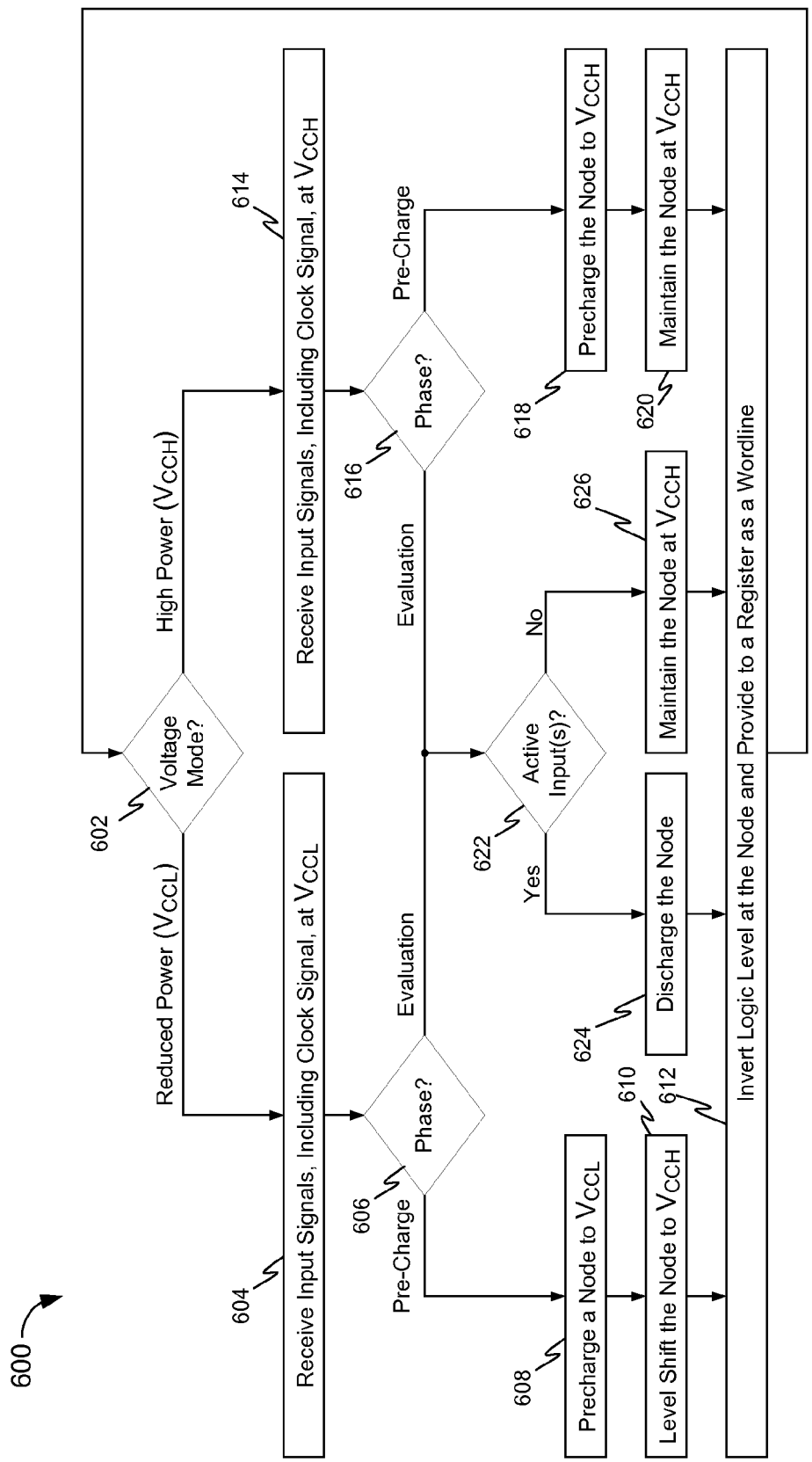

FIG. 6 is a process flowchart of a method to selectively level shift a node from a first voltage level to a second voltage level.

In the drawings, the leftmost digit(s) of a reference number identifies the drawing in which the reference number first appears.

DETAILED DESCRIPTION

Disclosed herein are methods and systems to selectively level shift signals in a multi-voltage or reference level environment, substantially without impacting signals that do not need level shifting.

Figure 1:
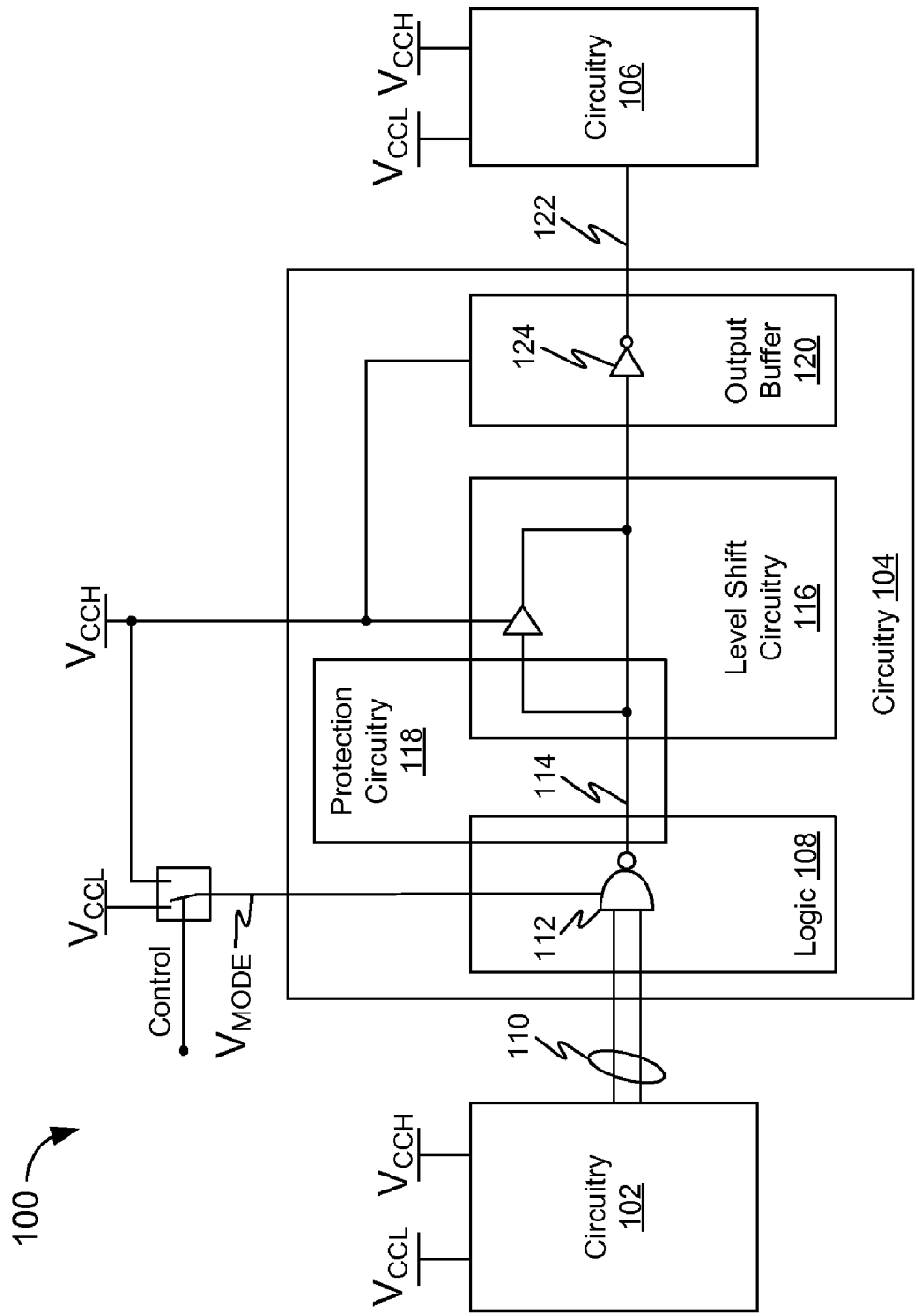
FIG. 1 is a block diagram of a system including selective level shift circuitry.

FIG. 1 is a block diagram of a system 100 including multiple voltage mode (multi-mode) circuitry 102, selective level shift circuitry 104, and circuitry 106.

Multi-mode circuitry 102 may include circuitry that selectively operates with respect one of a plurality of reference or voltage levels.

Selective level shift circuitry 104 may include logic 108 to perform one or more logical operations on outputs 110 of multi-mode circuitry 102. In the example of FIG. 1, logic 108 includes NAND logic 112. Logic 108 is not, however, limited to NAND logic.

Circuitry 102 may be configured to generate outputs 110 with respect to one of a plurality of voltage reference levels, illustrated here as $V_{CCL}$ and $V_{CCH}$. $V_{CCL}$ and $V_{CCH}$ may be positive, and $V_{CCH}$ may be greater than $V_{CCL}$. Alternatively, $V_{CCL}$ and $V_{CCH}$ may be negative, and $V_{CCH}$ may be greater than $V_{CCL}$. In a relatively high performance mode of operation, circuitry 102 may generate outputs 110 relative to, or having a voltage swing of $V_{CCH}$. In a reduced power mode of operation, circuitry 102 may generate outputs 110 relative to $V_{CCL}$.

Logic 108 may be configured to selectively operate under control of one of $V_{CCL}$ and $V_{CCH}$, in accordance with a voltage mode of outputs 110. In reduced power mode, logic 108 outputs logic levels to a node 114 relative to $V_{CCL}$. In high performance mode, logic 108 outputs logic levels to node 114 relative to $V_{CCH}$.

Circuitry 104 includes level shift circuitry 116 to selectively level shift logic levels at node 114 from $V_{CCL}$ to $V_{CCH}$ in reduced power mode, and to maintain logic levels at node 114 at $V_{CCH}$ in high performance mode.

Level shift circuitry 116 may be configured to level shift within one gate stage.

In high performance mode, where logic 108 outputs logic levels to node 114 relative to $V_{CCH}$ and level shift circuitry 116 maintains the logic levels at node 114 at $V_{CCH}$, level shift circuitry may have little or no delay impact at node 114.

Circuitry 104 may include protection circuitry 118 to isolate $V_{CCL}$ and $V_{CCH}$ from one another when logic 108 operates in reduced power mode.

Circuitry 104 may include output circuitry 120 to output logic from node 114 to an output node 122 relative to $V_{CCH}$. In the example of FIG. 1, output circuitry 120 includes inverter circuitry 124. Output circuitry 120 is not, however, limited to inverter circuitry 124.

Circuitry 106 may include circuitry that operates at $V_{CCH}$, and may include circuitry that selectively operates at one of $V_{CCH}$ and $V_{CCL}$, in accordance with an operating mode of multi-mode circuitry 102.

System 100 may correspond to a computer system, or a portion thereof, and circuitry 104 may correspond to wordline driver circuitry to pre-charge and drive read and write worldlines to a register or memory that operates relative to $V_{CCH}$.

Figure 2:
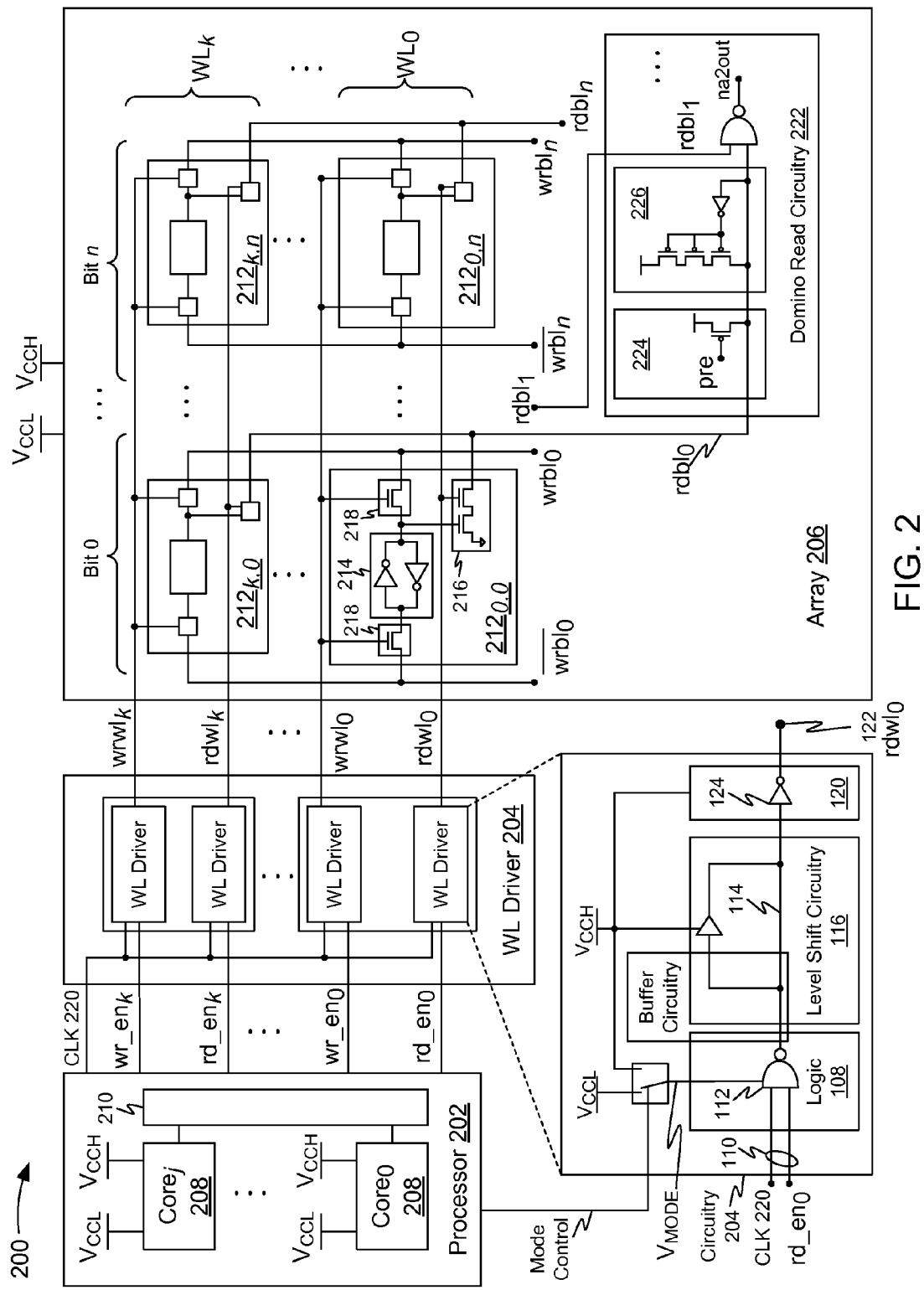
FIG. 2 is a block diagram of a computer system including a multi-core processor, wordline driver circuitry, and a register or array of memory cells.

FIG. 2 is a block diagram of a computer system 200, including a processor 202, wordline driver circuitry 204, and an array 206 of memory cells 212. Memory cells 212 may be arranged as k, n-bit words, where n and k are positive integers. Array 206 may correspond to a register of processor 200. Processor 202, wordline driver circuitry 204, and array 206 may correspond to circuitry 102, 104, and 106, respectively, in FIG. 1.

Processor 202 may include a plurality of processor cores 208 and address decoder circuitry 210. Address decoder circuitry 210 may include circuitry shared amongst a plurality of cores 208, and/or circuitry dedicated to one or more of cores 208. Cores 208 may be configured to access memory cells 212 during an evaluation phase. Access may include one or more of read and write.

Cores 208, or a portion thereof, may be configured to selectively operate at one of a plurality of reference or voltage levels, such as $V_{CCL}$ and $V_{CCH}$. At a given time, a first set of one or more cores 208 may operate at $V_{CCH}$, or high performance mode, and another set of one or more cores 208 may operate at $V_{CCL}$, or reduced power mode. One or more cores 208 may be configured to selectively switch between high performance mode and reduced power mode.

When a core 208 is in reduced power mode, processor 202 may output decoded address bits and a clock signal CLK 220 relative to $V_{CCL}$. When a core 208 is in high performance mode, processor 202 may output decoded address bits and clock signal CLK 220 relative to $V_{CCH}$.

In the example of FIG. 2, processor 202 outputs separate address lines for read and write operations, illustrated here as read wordlines rd_en$_0$ through rd_en$_k$, and write worldliness wr_en$_0$ through wr_en$_k$. Alternatively, processor 202 may output a common set of address bits for both read and write operations, along with read and write enable signals, and other circuitry, such as wordline driver circuitry 204, may be configured to generate separate read and write wordlines from the common address lines and the read and write enable signals.

WL driver circuitry 204 may include NAND logic to NAND each of the decoded address bits with clock signal CLK 220, and to output corresponding read wordlines rdwl$_0$ through rdwl$_k$, and write wordlines wrwl$_0$ through wrwl$_k$. WL driver circuitry 204 may include one or more instances of circuitry 104 (FIG. 1), including logic 108 to perform a NAND operation with respect to CLK 220 and a corresponding one of rd_en$_0$ through rd_en$_k$ and wr_en$_0$ through wr_en$_k$. Logic 108 may be configured to operate in one of high performance mode and reduced power mode, in accordance with a selected core 208.

Within array 206, memory cells 212 may each include a cross-coupled inverter circuit 214 to store a logic value and its compliment in a feedback locked loop.

Memory cells 212 may each include a read circuit 216 to output stored logic values to corresponding read bitlines rdbl$_0$ through rdbl$_k$, under control of corresponding read wordlines rdwl$_0$ through rdwl$_k$. The bits may be read from read bitlines rdbl$_0$ through rdbl$_k$ in a domino manner, such as with domino read circuitry 222.

Memory cells 212 may each include a pair of write circuits 218 to write logic values from write bit lines wrbl$_0$ through wrbl$_n$, and complimentary logic values from write bit lines $\overline{wrbl_0}$ through $\overline{wrbl_0}$, to corresponding memory cells 212, under control of corresponding write wordlines wrwl$_0$ through wrwl$_k$.

Array 206, or a portion thereof, may be controllable to operate in a voltage mode of a corresponding core 208, illustrated here as a selected one of $V_{CCL}$ and $V_{CCH}$. For example, and without limitation, memory cells 214 and domino read circuitry 222 may be controllable to selectively operate at $V_{CCL}$ and $V_{CCH}$. This may further reduce power consumption of computer system 200.

Memory array 206 may present contention issues during read and/or write operations.

For example, during a write operation, when a logic value is written over a complimentary logic value in a memory cell 212, there may be contention from the existing complimentary logic value.

Regarding read operations, domino read circuitry 222 may include pre-charge circuitry 224 to pre-charge read bit line rdbl$_0$ to the corresponding operating voltage, $V_{CCL}$ or $V_{CCH}$, and keeper circuitry 226 to thereafter maintain read bit line rdbl$_0$ at the pre-charge level. When a logic value of one is read from bit 0 of one of words 0 through k onto read bitline rdbl$_0$, rdbl$_0$ remains at the pre-charge level without contention. When, however, a logic value of zero is read from bit 0 of one of words 0 through k onto read bitline rdbl$_0$, the logic value of zero may face contention from keeper circuitry 226. Domino read circuitry 222 may include similar circuitry for bits 1 through n.

WL driver circuitry 204 may be configured to provide wordlines to array 206 relative to $V_{CCH}$. This may reduce contention during read and write operations, and may reduce read and write delay when a core 208 and/or memory cell 214 operate in reduced power mode, and may permit a core 208 to operate at a lower voltage level than array 206.

WL driver circuitry 204 may be configured to level shift during pre-charge phases and not during evaluation phases, which may avoid adding delay during evaluation phases. WL driver circuitry 204 may be configured to selectively level shift only when in reduced power mode, which may avoid adding delay during pre-charge phases when in high performance mode.

FIG. 3 is a circuit diagram of an exemplary circuit 300, which may correspond to circuitry 104 in one or more of FIGS. 1 and 2. For example, in FIG. 3, CLK 302 and EN 304 may correspond to outputs 110 of circuitry 102 in FIG. 1. CLK 302 may correspond to CLK 220 in FIG. 2, and EN 304 may correspond to one of wordlines rd_en$_0$ through rd_en$_k$ and wr_en$_0$ through wr_en$_k$ in FIG. 2. A node WLB 314 in FIG. 3 may correspond to node 114 in one or more of FIGS. 1 and 2. A node WL 322 in FIG. 3 may correspond to node 122 in one or more of FIGS. 1 and 2. Inverter circuitry 320 in FIG. 3 may correspond to circuitry 120 in one or more of FIGS. 1 and 2.

FIG. 4. is a graphic illustration of an exemplary timing diagram 400, described below with respect to circuit 300. Circuit 300 is not however limited to the example of FIG. 4.

Timing diagram 400 includes pre-charge phases 404 and 412, and evaluation phases 402, 406, and 414. Evaluation phases 402, 406, and 414 may be defined by active phases of CLK 302.

During evaluation phase 402, CLK 302 and EN 304 are high, which may be one of $V_{CCL}$ and $V_{CCH}$. As will be understood from the description below, prior to the end of evaluation phase 402, transistors NEN, NCLK, and PCLK1 are on, transistors PCLK0, PLS0, and PLS1 are off, node WLB 314 is low, and node WL 322 is high.

At the onset of pre-charge phase 404, CLK 302 and EN 304 go low.

During a first stage 408 of pre-charge phase 404, low CLK 302 and low EN 304 cause transistors NCLK and NEN to turn off. Low CLK 302 further causes transistors PCLK0 and PLS1 to turn on. Transistor PCLK1 is still on from prior evaluation phase 402. Node WLB 314 is thus decoupled from low source node 330 and coupled to $V_{MODE}$ through transistors PCLK0 and PCLK1. In reduced power mode, where $V_{MODE}$ is set to $V_{CCL}$, node WLB 314 is pre-charged to $V_{CCL}$ during first stage 408. In high performance mode, where $V_{MODE}$ is set to $V_{CCH}$, node WLB 314 is pre-charged to $V_{CCH}$ during first stage 408. First stage 408 may correspond to a transistor gate stage, or a response time associated with a transistor.

During a second stage 410 of pre-charge phase 404, in response to $V_{MODE}$ at node WLB 314, inverter INV0 causes node N0 to go low. Low node N0 causes transistor PLS0 to turn on, which, together with transistor PLS1, couples $V_{CCH}$ to node WLB 314. Low node N0 also causes INV1 to set node N1 to $V_{CCH}$, which causes transistor PCLK1 to turn off and isolate $V_{MODE}$ from node WLB 314. In reduced power mode, where node WLB 314 is pre-charged to $V_{CCL}$ during stage 408, node WLB 314 is thus level shifted to $V_{CCH}$ during second stage 410. In high performance mode, where node WLB 314 is pre-charged to $V_{CCH}$ during stage 408, node WLB 314 is maintained at $V_{CCH}$ during second stage 410. Second stage 410 may correspond to a transistor gate stage.

During evaluation phase 406, CLK 302 goes high, which may be one of $V_{CCL}$ and $V_{CCH}$.

When CLK 302 goes high, transistor PCLK0 turns off, transistor NCLK turns on, and transistor PLS1 turns at least partially off.

When EN 302 goes high, transistor NEN turns on and node WLB 314 begins to discharge through transistors NEN and NCLK, potentially contending against partially on transistor PLS1. As node WLB 314 falls, node N0 rises to turn off transistor PLS0, which permits node WLB 314 to fully discharge. The discharging of node WLB 314 may correspond to a rising transition at node WL 322. In both reduced power mode and high performance mode, the rising transition at node WL 322 may occur over two gate stages corresponding to transistor NEN and inverter 320.

Circuit 300 may include keeper circuitry 332 to maintain node WLB 314 at $V_{CCH}$ in the event that CLK 302 goes high and EN 304 remains low. In the example of FIG. 3, keeper circuitry 332 includes transistors PKEN and PK, series coupled between $V_{CCH}$ and node WLB 314. When node WL 322 is low, corresponding to $V_{CCH}$ at node WLB 314, node WL 322 and EN 304 control transistors PK and PKEN, respectively, to maintain node WLB 314 at $V_{CCH}$. For example, during pre-charge phase 412 in FIG. 4, node WLB 314 is pre-charged to $V_{CCH}$ and node WL 322 is discharged. During subsequent evaluation phase 414, in which EN 304 remains inactive or low, transistors PKEN and PK maintain node WLB 314 at $V_{CCH}$. Alternative keeper circuitry is disclosed below with reference to FIG. 5.

In FIG. 4, relative timings and durations of CLK 302, EN 304, and stages 408 and 410 are illustrated for exemplary purposes. Other relative timings and durations may be implemented.

Where multiple circuits 300 are implemented in a system, such as system 200 in FIG. 2, one or more transistors of circuit 300 that are not controlled responsive to a wordline enable signal may be shared amongst multiple circuits. This may reduce area and power requirements.

FIG. 5 is a circuit diagram of an exemplary circuit 500, including shared clock circuitry 502. In the example of FIG. 5, shared clock circuitry 502 includes transistors PCLK0 and NCLK of FIG. 3, which are shared amongst multiple wordline driver circuits 504. Sharing of transistors amongst multiple wordline driver circuits may reduce clock loading and circuit area.

In the example of FIG. 5, keeper functionality is implemented with transistor PKEN coupled between node N1 and node WLB 314 and controlled by an enable signal EN 506. Functionality of transistor PK in FIG. 3 is performed by INV1 in FIG. 5. In operation, as node WLB 314 is pre-charged to $V_{CCH}$ during pre-charge phase 404 (FIG. 4), node N1 goes to $V_{CCH}$ and transistor PKEN couples $V_{CCH}$ at node N1 to node WLB 314 thereafter. Transistor PKEN maintains node WLB 314 at $V_{CCH}$ until EN 506 goes high. For example, during pre-charge phase 412 in FIG. 4, node WLB 314 is pre-charged to $V_{CCH}$. During subsequent evaluation phase 414, in which EN 304 remains inactive or low, transistor PKEN maintains node WLB 314 at $V_{CCH}$.

FIG. 6 is a process flowchart of an exemplary method of selectively level shifting a node. FIG. 6 is described below with reference to examples above. FIG. 6 is not, however, limited to the examples above.

At 602, a voltage mode is determined or selected. In the example of FIG. 2 above, a voltage mode may be determined in accordance with a selected processor core 208.

Where the voltage mode at 602 corresponds to a reduced power or $V_{CCL}$ mode, processing proceeds to 604, where input signals are received with respect to the reduced power mode. The input signals may include a clock signal and an address bit, each having a voltage swing of $V_{CCL}$.

At 606, a phase is determined as between a pre-charge phase and an evaluation phase. The phase may be determined from the clock signal.

During the pre-charge phase, processing proceeds to 608, where a node is pre-charged to $V_{CCL}$. This may coincide with a first stage of the pre-charge phase, which may correspond to a transistor gate stage.

At 610, the node is level shifted to $V_{CCH}$. This may coincide with a second stage of the pre-charge phase, which may correspond to a transistor gate stage.

Returning to 602, where the voltage mode corresponds to a high performance or $V_{CCH}$ mode, processing proceeds to 614, where input signals are received with respect to the high performance mode. The input signals may include a clock signal and an address bit, each having a voltage swing of $V_{CCH}$.

At 616, a phase is determined as between the pre-charge phase and the evaluation phase, such as described above with respect to 606.

During the pre-charge phase, processing proceeds to 618, where the node is pre-charged to $V_{CCH}$. This may coincide with the first stage of the pre-charge phase.

At 620, the node is maintained at $V_{CCH}$. This may coincide with the second stage of the pre-charge phase.

Returning to 606 and 616, during evaluation phases, processing proceeds to 622. When one or more inputs are active, such as EN 304 in FIG. 3, processing proceeds to 624, where the node is discharged. When the one or more inputs are inactive, processing proceeds to 626, where the node is maintained at $V_{CCH}$.

At 612, a logic state of the node may be inverted and provided to a register as a wordline at 612. 612 may follow one or more of 610, 620, 624, and 626.

Methods and systems disclosed herein may be configured to receive and logically process a clock signal relative to $V_{CCL}$ when in reduced power mode and relative to $V_{CCH}$ when in high performance mode. Similar timing margins may apply in both situations, which may simplify timing analyses relative to a situation where a clock signal is level shifted.

Methods and systems disclosed herein may be implemented to level shift both read and write wordline to a relatively high voltage in a dual-voltage mode register file, which may improve read and write contention and delay, may permit a processor to operate at a lower voltage level than a register, and may permit read pull-down circuits and write transfer circuits to be downsized and thereby reduce area requirements.

Methods and systems disclosed herein are described with respect to relative logic states including, "low," "high," "active," "inactive," "on" and "off." One or more features described herein may be implemented in a complimentary fashion. For example, and without limitation, a circuit may be configured to receive one or more active low inputs, such as an active low enable signal, and combinations of active high and active low inputs.

Exemplary circuit diagrams disclosed herein include combinations of p-type transistors and n-type transistors. One or more features disclosed herein may be implemented with other combinations of p-type transistors, n-type transistors, combinations thereof, and other devices, and are thus not limited to the examples herein.

One or more features disclosed herein may be implemented in one or more of discrete and integrated circuit logic, including application specific integrated circuit (ASIC) logic, and may be implemented as part of a domain-specific integrated circuit package, or a combination of integrated circuit packages.

Methods and systems are disclosed herein with the aid of functional building blocks illustrating the functions, features, and relationships thereof. At least some of the boundaries of these functional building blocks have been arbitrarily defined herein for the convenience of the description. Alternate boundaries may be defined so long as the specified functions and relationships thereof are appropriately performed.

While various embodiments are disclosed herein, it should be understood that they have been presented by way of example only, and not limitation. It will be apparent to persons skilled in the relevant art that various changes in form and detail may be made therein without departing from the spirit and scope of the methods and systems disclosed herein. Thus, the breadth and scope of the claims should not be limited by any of the exemplary embodiments disclosed herein.

What is claimed is:

1. A system, comprising:
  logic circuitry controllable to operate in first and second voltage level modes, including to receive inputs at a corresponding one of a first voltage levels and a second voltage level, and to charge a node to a corresponding one of the first and second voltage levels during a first stage of a pre-charge phase; and
  level shift circuitry to level shift the node from the first voltage level to the second voltage level during a second stage of the pre-charge phase when the logic circuitry is in the first voltage level mode, and to maintain the node at the second voltage level during the second stage of the pre-charge phase when the logic circuitry is in the second voltage level mode.

2. The system of claim 1, wherein:
  the first and second stages of the pre-charge phase are each substantially equal to one transistor gate stage; and
  the level shift circuitry is configured to introduce substantially no delay at the node when the logic circuitry is in the second voltage level mode.

3. The system of claim 1, wherein:
  the logic circuitry includes discharge circuitry to discharge the output node within one transistor gate stage during an evaluation phase when a control input is active, in the first and second voltage level modes.

4. The system of claim 3, further comprising:
  keeper circuitry to maintain the node at the second voltage level during the evaluation phase when the control input to the logic circuitry is inactive.

5. The system of claim 1, wherein the logic circuitry is configured to receive and logically combine a clock signal and an enable signal at first voltage level when in the first voltage level mode, and to receive the clock signal and enable signal at the second voltage level when in the second voltage level mode.

6. A system, comprising:
  a clock node and an enable node to receive clock and enable signals, respectively, at a selected one of a first voltage level and a second voltage level;
  a voltage mode control node to receive the selected one of the first and second voltage levels;
  a second voltage level node to receive the second voltage level;
  an output node;
  logic circuitry to couple the voltage mode control node to the output node when the clock node, the enable node, and the output node are inactive, and to discharge the output node when the clock node and the enable node are active; and
  level shift circuitry to decouple the output node from the voltage mode control node and to couple the second voltage level node to the output node when the clock node and the enable node are inactive and the output node is at least at the first voltage level.

7. The system of claim 6, wherein:
  the logic circuitry is configured to couple the voltage mode control node to the output node within one transistor gate stage, and to discharge the output node within one transistor gate stage; and
  the level shift circuitry is configured to decouple the output node from the voltage mode control node and to couple the second voltage level node to the output node within one transistor gate stage.

8. The system of claim 6, further comprising:
  keeper circuitry to maintain the output node at the second voltage level when the enable node is inactive.

9. The system of claim 8, wherein the keeper circuitry includes:
  a switch coupled between the second voltage node and the output node and controllable by the enable node.

10. The system of claim 8, further including an inverter coupled to the output node, wherein the keeper circuitry includes:
  first and second switches coupled in series between the second voltage node and the output node and controllable by the enable node and an output of the inverter, respectively.

11. A system, comprising:
  a processor including a plurality of processor cores, each controllable to operate in one of a first and second voltage level mode and to output decoded register word address bits at a corresponding one of the first and second voltage levels, the processor including circuitry to select one of the processor cores to access a register;
  logic circuitry controllable to operate in the voltage level mode of the selected processor core, including to receive the address bits at the corresponding voltage level, and to charge corresponding wordline drive nodes to the corresponding voltage level during a first stage of a pre-charge phase; and
  level shift circuitry to level shift the wordline drive nodes from the first voltage level to the second voltage level during a second stage of the pre-charge phase when the logic circuitry is in the first voltage level mode, and to maintain the wordline drive nodes at the second voltage level during the second stage of the pre-charge phase when the logic circuitry is in the second voltage level mode.

12. The system of claim 11, wherein:
  the first and second stages of the pre-charge phase are each substantially equal to one transistor gate stage; and
  the level shift circuitry is configured to introduce substantially no delay at the wordline drive nodes when the logic circuitry is in the second voltage level node.

13. The system of claim 11, wherein:
  the logic circuitry includes discharge circuitry to selectively discharge the wordline drive nodes within one transistor gate stage during evaluation phases in the first and second voltage modes, when corresponding address bits are active.

14. The system of claim 13, further comprising:

keeper circuitry to selectively maintain the wordline drive nodes at the second voltage level during the evaluation phase when the corresponding address bits are inactive.

15. The system according to claim 11, further including, for each address bit:

a clock node and an address bit node to receive a clock signal and a corresponding address bit, respectively, at a selected one of a first and second voltage levels;

a voltage mode control node to receive the selected one of the first and second voltage levels;

a second voltage level node to receive the second voltage level;

logic circuitry to couple the voltage mode control node to the corresponding wordline drive node when the clock node, the address bit node, and the wordline drive node are inactive, and to discharge the wordline drive node when the clock node and the address bit node are active; and level shift circuitry to decouple the wordline drive node from the voltage mode control node and to couple the second voltage level node to the wordline drive node when the clock node and the address bit node are inactive and the wordline drive node is at least at the first voltage level.

16. The system of claim 15, wherein:

the logic circuitry for each address bit is configured to couple the voltage mode control node to the corresponding wordline drive node within one transistor gate stage, and to discharge the wordline drive node within one transistor gate stage; and the level shift circuitry for each address bit is configured to decouple the corresponding wordline drive node from the voltage mode control node and to couple the second voltage level node to the wordline drive node within one transistor gate stage.

17. The system of claim 15, further comprising, for each address bit:

keeper circuitry to maintain the corresponding wordline drive node at the second voltage level when the corresponding address bit node is inactive.

18. The system of claim 17, wherein the keeper circuitry includes:

a switch coupled between the second voltage node and the corresponding wordline drive node and controllable by the corresponding address bit node.

19. The system of claim 17, further comprising, for each address bit, an inverter coupled to the corresponding wordline drive node, wherein the keeper circuitry includes:

first and second switches coupled in series between the second voltage node and the corresponding wordline drive node and controllable by the corresponding address bit node and an output of the inverter, respectively.

20. The system of claim 11, further comprising:

an array of memory cells controllable to operate in the voltage level mode of the selected processor core; and read and write circuits associated with the memory cells to receive corresponding read and write control outputs of the level shift circuitry relative to the second voltage in both the first and second voltage level modes.

\* \* \* \* \*